United States Patent
Kalleder et al.

(10) Patent No.: US 6,863,923 B1
(45) Date of Patent: Mar. 8, 2005

(54) METHOD AND COMPOSITIONS FOR PRINTING SUBSTRATES

(75) Inventors: Axel Kalleder, Blieskastel (DE); Rainer Kreutzer, Saarlouis (DE); Martin Mennig, Quierschied (DE); Helmut Schmidt, Saarbruecken-Guedingen (DE)

(73) Assignee: Institut fuer Neue Materialien gemeinnuetzige GmbH, Saarbruecken (DE)

( * ) Notice: Subject to any disclaimer, the term of this patent is extended or adjusted under 35 U.S.C. 154(b) by 0 days.

(21) Appl. No.: 10/088,794
(22) PCT Filed: Sep. 28, 2000
(86) PCT No.: PCT/EP00/09523

§ 371 (c)(1),
(2), (4) Date: Jun. 14, 2002

(87) PCT Pub. No.: WO01/23190

PCT Pub. Date: Apr. 5, 2001

(30) Foreign Application Priority Data

Sep. 29, 1999 (DE) .......................................... 199 46 712

(51) Int. Cl.⁷ ................................................. B05D 3/02
(52) U.S. Cl. .......................... 427/226; 427/64; 427/256; 427/387; 427/389.7; 428/428; 428/447; 524/386; 524/387; 524/424; 524/430; 524/588; 106/287.1
(58) Field of Search .......................... 427/64, 226, 256, 427/387, 389.7, 96; 428/428, 447, 901; 524/386, 387, 424, 430, 588; 106/287.1

(56) References Cited

U.S. PATENT DOCUMENTS

| | | |
|---|---|---|
| 4,731,264 A | 3/1988 | Lin et al. |
| 4,753,827 A | 6/1988 | Yoldas et al. |
| 4,754,012 A | 6/1988 | Yoldas et al. |
| 4,799,963 A | 1/1989 | Basil et al. |
| 4,814,017 A | 3/1989 | Yoldas et al. |
| 5,231,156 A | 7/1993 | Lin |
| 5,891,520 A | 4/1999 | Makar et al. |
| 6,136,083 A | 10/2000 | Schmidt et al. |
| 6,538,092 B1 * | 3/2003 | Terry et al. ................... 528/26 |

FOREIGN PATENT DOCUMENTS

| | | | |
|---|---|---|---|
| DE | 19520964 | 12/1996 | |
| EP | 0263428 | 4/1988 | |
| JP | 62230873 A | * 10/1987 | ........... C09D/11/10 |
| JP | 2-122982 | 5/1990 | |
| JP | 6-100818 | 4/1994 | |
| JP | 10195280 | 7/1998 | |
| JP | 10204296 | 8/1998 | |
| WO | 99/00197 | 1/1999 | |

OTHER PUBLICATIONS

English Language Abstract of JP 10–204296.
English Language Abstract of JP 6–100818.
English Language Abstract of JP 10–195280.
English Language Abstract of JP 2–122982.
$TiO_2$ Photocatalysis Fundamentals and Applications, 1st edition May 1999, BKC Inc., topics "Self–cleaning lamp cover" to "Self–sterilizing photocatalytic tiles".
Römpp Lexikon, Lacke und Druckfarben, Georg Thieme Verlag 1998, p. 497.
Ullmann's Encyclopedia of Industrial Chemistry, 5th Edition, vol. A23, VCH Verlagsgesellschaft, Weinheim, Germany, 1991, pp. 469–470; 614–616, 618–619, 623–629, and 635–641.
Industrielle Anorganische Chemie, 2nd edition, VCH Verlagsgesellschaft, Weinheim, Germany, p. 5.9.

* cited by examiner

*Primary Examiner*—Margaret G. Moore
*Assistant Examiner*—Marc S Zimmer
(74) *Attorney, Agent, or Firm*—Greenblum & Bernstein, P.L.C.

(57) ABSTRACT

Processes and compositions for printing substrates. A printing paste containing a matrix-forming precondensate containing polyorganosiloxanes obtained by a sol-gel process and at least one coloring, luminescent, conductive and/or catalytically active filler is applied imagewise to the substrate and is densified by heat treatment at a temperature below the glass transition temperature of the matrix being formed. The processes and printing pastes are suitable, for example, for the production of conductor tracks and decorative patterns.

33 Claims, No Drawings

METHOD AND COMPOSITIONS FOR PRINTING SUBSTRATES

The invention relates to a process for the production of printed substrates in which a special printing paste is applied imagewise to a substrate and densified by heat treatment, and to compositions which are suitable for carrying out this process.

Conductive printing pastes, in particular conductive screen-printing pastes, for printing substrates with conductive components, such as, for example, conductor tracks, are, in accordance with the prior art, prepared using, generally, low-melting glass particles, for example glass frits, with admixture of conductive metal powders. To these are added further components, usually of an organic nature, which facilitate the establishment of a suitable rheology, for example a pronounced thixotropic behavior. These components are usually organic oligomers, for example fish oils, celluloses and cellulose derivatives, polyalcohols or similar substances. After application by a printing process, for example screen printing or pad printing, the printed areas are fired, during which the glass melts and a matrix forms for the percolating metal particles. Disadvantages of this method are the relatively high firing temperature of at least 600 to 700° C. and the formation of a low-viscosity phase, which has the effect that the aspect ratios are relatively low, i.e. the lines are fairly broad owing to the melting behavior of the glass. In addition to the metal particles, other particles, for example colored pigments, may also be admixed with glass particles of this type.

EP-A-535374 describes the use of silanes as additives in screen-printing enamels. However, the function of these additives consists merely in fixing the decorative prints after drying. Glass particles are employed in the printing pastes described therein.

DE-A-195 20 964 describes the composition of a sol-gel screen-printing material in which glass frits and optionally xerogel particles are employed. The starting materials used can be silicates.

The object according to the invention consisted in providing a simple and inexpensive process for the production of printed substrates using a printing paste which can be densified even at relatively low temperatures to give a stable, strongly adherent, imagewise layer, which may also be in structured form, for example in the form of conductor tracks, and by means of which line images can be produced with very high resolution. The aim here is to avoid the use of heavy-metal components for the matrix, which were hitherto necessary in order to lower the melting point of the matrix.

The abovementioned object is achieved in accordance with the invention by a process for the production of printed substrates in which a printing paste comprising a) a matrix-forming condensate based on polyorganosiloxanes which is obtained by the sol-gel process, and b) one or more coloring, luminescent, conductive and/or catalytically active fillers, is applied imagewise to the substrate and densified by heat treatment, said process being characterized in that densification is carried out at a temperature which is lower than the glass transition temperature of the matrix forming.

On use of metal powders as fillers, conductor tracks with a very high degree of densification, which are the prerequisite for high conductivity and a high degree of percolation, are, surprisingly, produced in the process according to the invention, although fluxing media are not added to the system, as in the case of the conventional use of glass particles or glass frits. The technical advantage of this process consists in that, in contrast to the prior art, melting is avoided, and the printed structures thus do not spread out. The geometry of the printed lines or image patterns is thus kept within very narrow dimensions; in the case of line images, very fine lines, for example, of high edge sharpness and with an aspect ratio which is significantly greater than that of the prior art are achieved. If other fillers are used instead of the metallic conductors preferably employed, decorative patterns and lines or areas can thus also be produced by printing. In a similar manner, embossed or extruded structures can be produced.

The substrates employed in the process according to the invention can be any desired heat-resistant materials, for example metals, alloys, plastics, ceramic, glass-ceramic or glass. Preferred substrates are ceramic, glass-ceramic and glass. The substrate may also be pre-coated. In particular in the case of applications in which conductive fillers are employed, for example for the production of conductor tracks, use is preferably made of substrates having a conductive coating, in particular glass having a conductive coating. The substrates or glass substrates having a conductive coating are known in the art and are commercially available. The coating may be, for example, tin oxide or indium tin oxide (ITO). In the process according to the invention, the substrate serves as print carrier, to which the image pattern is applied.

Suitable printing processes are generally all processes in which printing pastes are employed. Preference is given to screen printing, offset printing and pad printing.

The process according to the invention is particularly suitable for printing substrates with conductive components, as used, for example, for the production of conductor tracks. Conductive printing pastes containing conductive fillers as a component are employed for this purpose. Corresponding fillers are explained in greater detail below.

The printing paste is applied imagewise to the substrate. The term "imagewise" here means that the printing paste is not applied as a full-area layer, but instead in any desired pattern. Owing to the high resolution that can be achieved therewith, the process according to the invention is particularly suitable for the production of very fine patterns.

After the printing paste has been applied to the substrate, it is optionally dried, for example at temperatures of from 80 to 200° C.

The printing paste is preferably densified by heat treatment, preferably after drying. During the densification, the printed structures are not melted, but instead the heat treatment is carried out at a temperature which is lower than the glass transition temperature of the matrix forming. The heat treatment is preferably carried out at a temperature which is at least 200° C., preferably at least 400° C., lower than the glass transition temperature of the matrix forming. Depending on the matrix forming (for example $SiO_2$), the firing temperature may be as much as from 600 to 700° C. below the glass transition temperature.

The heat treatment is preferably carried out at temperatures in the range from 400° C. to 800° C., more preferably from 450° C. to 600° C.

The printing paste employed in accordance with the invention comprises a matrix-forming condensate based on polyorganosiloxanes which is obtained by the sol-gel process. The sol-gel process is a process which is known in the art. In accordance with the invention, partial hydrolysis and polycondensation of the hydrolysable compounds, in particular hydrolysable silanes, gives a condensate which is not yet fully condensed (precondensate). The degree of condensation is, for example, from 20 to 80%, preferably from 40 to 60%. The liquid sol obtained in this way is employed for the preparation of the printing paste. The further condensation takes place during later drying or densification.

The matrix-forming condensate based on polyorganosiloxanes is obtainable, for example, by partial hydrolysis and polycondensation of:

(A) at least one organosilane of the general formula (I)

$$R_nSiX_{(4-n)} \qquad (I)$$

in which the radicals X are identical or different and are hydrolysable groups or hydroxyl groups, R is identical or different and is a non-hydrolysable radical, and n is 1, 2 or 3, or an oligomer derived thereof, (B) optionally at least one hydrolysable silane of the general formula (II)

$$SiX_4 \qquad (II)$$

in which X is as defined above, and (C) optionally one or more compounds of glass- or ceramic-forming elements.

In the organosilanes of the formula (I) and the hydrolysable silanes of the formula (II), the hydrolysable groups X are, for example, hydrogen or halogen (F, Cl, Br or I), alkoxy (preferably $C_{1-6}$-alkoxy, such as, for example, methoxy, ethoxy, n-propoxy, i-propoxy and butoxy), aryloxy (preferably $C_{6-10}$-aryloxy, such as, for example, phenoxy), acyloxy (for example $C_{1-6}$-acyloxy, such as, for example, acetoxy or propionyloxy), alkylcarbonyl (preferably $C_{2-7}$-alkylcarbonyl, such as, for example, acetyl), amino, monoalkylamino or dialkylamino, preferably having from 1 to 12, in particular from 1 to 6, carbon atoms.

R is a non-hydrolysable organic radical, which may optionally carry a functional group. Examples of R are alkyl (preferably $C_{1-6}$-alkyl, such as methyl, ethyl, n-propyl, isopropyl, n-butyl, s-butyl and t-butyl, pentyl, hexyl or cyclohexyl), alkenyl (preferably $C_{2-6}$-alkenyl, such as, for example, vinyl, 1-propenyl, 2-propenyl and butenyl), alkynyl (preferably $C_{2-6}$-alkynyl, such as, for example, acetylenyl and propargyl), and aryl (preferably $C_{6-10}$-aryl, such as, for example, phenyl and naphthyl).

Specific examples of functional groups of the radical R are the epoxy, hydroxyl, ether, amino, monoalkylamino, dialkylamino, amide, carboxyl, mercapto, thioether, vinyl, acryloxy, methacryloxy, cyano, halogen, aldehyde, alkylcarbonyl, sulfonic acid and phosphoric acid groups. These functional groups are bonded to the silicon atom via alkylene, alkenylene or arylene bridging groups, which may be interrupted by oxygen or sulfur atoms or —NH— groups. The said bridging groups are derived, for example, from the above-mentioned alkyl, alkenyl or aryl radicals. The radicals R preferably contain from 1 to 18, in particular from 1 to 8, carbon atoms. The said radicals R and X may optionally have one or more conventional substituents, such as, for example, halogen or alkoxy.

In the general formula (I), n has the value 1, 2 or 3, preferably the value 1 or 2.

Particularly preferred hydrolysable silanes of the formula (II) are tetraalkoxysilanes, such as tetraethoxysilane (TEOS). Particularly preferred organosilanes of the formula (I) are epoxysilanes, such as 3-glycidyloxypropyltrimethoxysilane (GPTS), and monoalkyltrialkoxysilanes, such as methyltriethoxysilane (MTEOS).

The condensate may be prepared entirely from one or more organosilanes of the formula (I). If these organosilanes contain a functional group, this is also a preferred embodiment. In accordance with the invention, the condensate is prepared using at least 40 mol %, preferably at least 60 mol %, of the organosilane of the general formula (I). If the organosilane employed does not contain any functional groups, hydrolysable silanes of the formula (II) are preferably also employed. The condensate can be prepared using up to 60 mol %, preferably not more than 40 mol %, of hydrolysable silanes of the general formula (II).

If desired, the condensate can be prepared additionally using one or more compounds of glass- or ceramic-forming elements. These are preferably soluble or dispersible in the reaction medium. It is possible to use, for example, compounds (halides, alkoxides, carboxylates, chelates, etc.) of lithium, sodium, potassium, rubidium, cesium, beryllium, magnesium, calcium, strontium, barium, boron, aluminum, titanium, zirconium, tin, zinc or vanadium.

The hydrolysis and polycondensation are either carried out in the absence of a solvent or preferably in an aqueous or aqueous/organic reaction medium, optionally in the presence of an acidic or basic condensation catalyst, such as HCl, $HNO_3$ or $NH_3$. In the case of the use of a liquid reaction medium, the starting components are soluble in the reaction medium. Suitable organic solvents are, in particular, water-miscible solvents, for example monohydric or polyhydric aliphatic alcohols, ethers, esters, ketones, amides, sulfoxides and sulfones.

The hydrolysis and polycondensation are optionally carried out in the presence of a complexing agent, for example nitrates, β-dicarbonyl compounds (for example acetylacetonates or acetoacetates), carboxylic acids (for example methacrylic acid) or carboxylates (for example acetate, citrate or glycolate), betaines, diols, diamines (for example DIAMO) or crown ethers.

Besides the abovementioned sol (precondensate), the printing paste also comprises one or more coloring, luminescent, conductive and/or catalytically active fillers. These are preferably particles in the form of a powder having dimensions in the μm range (for example up to 30 μm) or in the sub-μm range. They may be, for example, spherical, lamellar or irregularly shaped bodies. The coloring fillers are, in particular, dyes and colored pigments. The luminescent fillers include, for example, photo- and electroluminescent substances. The conductive fillers are, in particular, electrically conductive and/or photoconductive materials. Catalytically active fillers are, for example, aluminum oxides, chromium oxides and titanium oxides. In the case of the conductive fillers, the printing paste preferably comprises from 50 to 80% by weight, particularly preferably from 70 to 75% by weight, of these fillers. If conductive fillers are employed, the densitied printing paste printed onto the carrier comprises at least 80% by weight, preferably at least 95% by weight, of fillers. If only coloring fillers are used, significantly lower proportions, for example less than 10% by weight, may be present in the printing paste to be applied, depending on the coloring power and the desired color effect.

Examples of materials which can be employed as conductive fillers are metals and metal oxides, but also other elements or element compounds, for example aluminum, gold, silver, copper, nickel, chromium, molybdenum, tungsten, tin oxide, indium tin oxide, lead zirconate titanate and graphite.

Coloring fillers which can be used are inorganic or organic substances which remain stable even at the densification temperatures. Suitable heat-resistant dyes are, for example, azo dyes, such as Methyl Orange, Alizarin Yellow or Congo Red; dispersion dyes, such as Disperse Red;

triphenylmethane dyes, such as Malachite Green, eosine, fluorescein, aurine and phenolphthalein; vat dyes, such as indigo, thioindigo and anthraquinone dyes; perylene dyes, and fluorescent dyes, such as Fluorescent Brightener 28. Pigments which can be used are, for example, mica-based pigments (Iriodin), phthalocyanines with, for example, Cu, Co, Ni, Zn or Cr as the central atom; carbon black pigments and $TiO_2$.

The printing paste may optionally also comprise nanoscale particles, for example metal colloids of Ag, Au, Cu, Pd and Pt, or metal compounds, for example (optionally hydrated) oxides, such as ZnO, CdO, $SiO_2$, $TiO_2$, $ZrO_2$, $CeO_2$, $SnO_2$, $Al_2O_3$, $In_2O_3$, $La_2O_3$, $Fe_2O_3$, $Cr_2O_3$, CuO, $Cu_2O$, $Mn_2O_3$, $Ta_2O_5$, $Nb_2O_5$, $V_2O_5$, PdO, $MoO_3$ or WO3; chalcogenides, such as, for example, sulfides (for example CdS, ZnS, PbS and $Ag_2S$), selenides (for example GaSe, CdSe and ZnSe) and tellurides (for example ZnTe or CdTe), halides, such as AgCl, AgBr, AgI, CuCl, CuBr, $CdI_2$ and $PbI_2$; carbides, such as $CdC_2$ or SiC; arsenides, such as AlAs, GaAs and GeAs; antimonides, such as InSb; nitrides, such as BN, AlN, $Si_3N_4$ and $Ti3N_4$; phosphides, such as GaP, InP, $Zn_3P_2$ and $Cd_3P_2$; phosphates, silicates, zirconates, aluminates, stannates and the corresponding mixed oxides (for example those having a perovskite structure, such as $BaTiO_3$ and $PbTiO_3$)

The nanoscale filler particles generally have a particle size in the range from 1 to 100 nm, preferably from 2 to 50 nm and particularly preferably from 5 to 20 nm. These materials can be employed either in the form of a powder or preferably in the form of a (in particular acid-stabilized) sol.

The amount of the coloring, luminescent and/or catalytically active filler depends on the desired functional properties of the coating, for example the desired color intensity.

The composition according to the invention which can be used as printing paste furthermore comprises one or more high-boiling organic solvents having a boiling point of at least 150° C., preferably at least 180° C., particularly preferably at least 200° C., in an amount of, in general, up to 50% by weight, for example from 1 to 30% by weight or from 1 to 10% by weight.

Preferred examples of suitable high-boiling organic solvents are di-, tri-, tetra-, penta- or hexamers of monoglycols, such as, for example, the di-, tri-, tetra-, penta- or hexamers of ethylene glycol, propylene glycol or butylene glycol, and mono- or diethers thereof, in which one or both hydroxyl groups may be replaced by, for example, a methoxy, ethoxy, propoxy or butoxy group; terpenes, for example terpineol; and polyols, for example 2-methyl-2,4-pentanediol. Especial high-boiling solvents are polyethylene glycols and ethers thereof, such as diethylene glycol, triethylene glycol and tetraethylene glycol, diethylene glycol diethyl ether, tetraethylene glycol dimethyl ether or diethylene glycol monobutyl ether. Of these, particular preference is given to diethylene glycol, tetraethylene glycol and diethylene glycol monobutyl ether. It is of course also possible to employ mixtures of two or more of these solvents.

The composition according to the invention which can be used as printing paste furthermore comprises one or more rheology control agents in an amount of preferably not more than 5% by weight, for example from 0.5 to 2% by weight. The rheology control agent serves to adjust the structural viscosity or the thixotropy of the printing pastes. Use can be made here of the rheology control agents usually used in accordance with the prior art. Examples of rheology control agents of this type are fish oils, celluloses, cellulose derivatives and polyalcohols.

The composition may additionally comprise conventional additives for printing pastes. However, the printing paste preferably comprises essentially no glass particles or glass frits that are usually employed in accordance with the prior art, which serve as matrix formers. This is because, surprisingly, the matrix-forming function is, in accordance with the invention, taken on by the (pre)condensate employed, in addition to its function as binder. Special glass particles which do not function as matrix former but instead, for example, serve as spacer and are therefore not melted, may, by contrast, be present in the composition used in accordance with the invention.

The components are combined and formed into a paste by methods known to the person skilled in the art, for example by mixing or compounding using a roll mill or a ball mill. Methods likewise known to the person skilled in the art are used to set the viscosity which is suitable for printing, for example with the aid of a rheology control agent.

The process according to the invention and the composition according to the invention are particularly suitable for the production of conductor tracks, for example very fine conductor tracks having widths of less than 100 μm and heights of up to 30 μm on glass, glass-ceramic and ceramic substrates, which can be used, in particular, for display technology and for photovoltaic applications. However, the process according to the invention and the composition according to the invention are also suitable for decorative applications, with high resolutions and thus the formation of very fine lines being possible.

EXAMPLES

Example 1

Preparation of a conductive screen-printing paste based on λ-glycidyloxypropyltrimethoxysilane (GPTS)

473.25 g of y-GPTS are mixed with 54.18 g of water and refluxed for 24 hours. The methanol liberated in the hydrolysis or alcoholysis (116.28 g) is removed in a rotary evaporator. The GPTS prehydrolysate prepared in this way is employed for the preparation of a printing paste. 38.0 g of silver powder (of which 19.0 g are lamellar silver powder>20 μm and 19.0 g are silver powder from 1.5 to 2.5 μm) are mixed with 2.375 g of the GPTS prehydrolysate. 0.076 g of hydroxypropylcellulose (average molecular weight 100 000 g/mol) dissolved in 5.82 g of tetraethylene glycol is added.

The resultant mixture can be formed into a paste in a roll mill or with the aid of a ball mill. Application takes place using the parameters (for example doctor blade speed up to a maximum of 60 cm/s) and materials (for example stainless steel sieve 325 mesh, silicone doctor blade) which are usual in screen printing. The densification is carried out at a temperature of greater than 450° C.

Example 2

Preparation of a decorative screen-printing paste based on λ-glycidyloxypropyltrimethoxysilane (GPTS)

The GPTS prehydrolysate is prepared as described in Example 1.

4.0 g of $TiO_2$ (Merck 808), 0.5 g of tetraethylene glycol and, in order to provide thixotropy, 0.02 g of hydroxypropylcellulose (average molecular weight 100 000 g/mol) dissolved in 0.94 g of terpineol are added to 2.37 g of this prehydrolysate.

The conversion into a paste and the application are carried out as in Example 1.

Example 3

Preparation of a screen-printing paste based on an organically modified, inorganic binder A mixture of 62.3 g of methyltriethoxysilane (MTEOS) and 21.68 g of tetraethoxysilane (TEOS) is initially introduced. 35.18 g of silica sol (Levasil 300/30) and 0.63 ml of concentrated hydrochloric acid are added with vigorous stirring. The mixture is hydrolyzed for 15 minutes in an ice bath. 75.0 g of terpineol are added to the mixture prepared in this way. After the mixture has been stirred for 15 minutes, the ethanol present in the mixture (58.94 g) is evaporated in a rotary evaporator.

1.3 g of Iriodin Silk Red WR2 and 0.1 ml of M50 silicone oil are added to 2.5 g of this mixture. In order to provide thixotropy, 0.2 g of ethylcellulose (average molecular weight 20 000 g/mol) dissolved in 1.8 g of terpineol are added.

The application is carried out as in Example 1.

What is claimed is:

1. A process for the production of a printed substrate, which process comprises:
   (i) image-wise applying to a substrate a printing paste comprising:
      (a) a matrix-forming condensate which comprises polyorganosiloxanes, obtainable by a sol-gel process; and
      (b) at least one filler selected from coloring fillers, luminescent fillers, conductive fillers and catalytically active fillers; and
   (ii) densifying the image-wise applied paste to form a matrix which contains the at least one filler by a heat treatment at a temperature below the glass transition temperature of the thus-formed matrix.

2. The process of claim 1, wherein the heat treatment is conducted at a temperature which is at least 200° C. below the glass transition temperature of the matrix.

3. The process of claim 1, wherein the heat treatment is conducted at a temperature which is at least 400° C. below the glass transition temperature of the matrix.

4. The process of claim 3, wherein the heat treatment is conducted at a temperature which is up to 700° C. below the glass transition temperature of the matrix.

5. The process of claim 2, wherein the heat treatment is conducted at a temperature of form 400° C. to 800° C.

6. The process of claim 1, wherein the printing paste is applied to the substrate by a process which comprises one of screen printing and pad printing.

7. The process of claim 1, wherein the substrate comprises at least one of a glass substrate, a glass-ceramic substrate and a ceramic substrate.

8. The process of claim 7, wherein the substrate comprises a conductive coating.

9. The process of claim 8, wherein the conductive coating comprises at least one of tin oxide and indium tin oxide.

10. The process of claim 1, wherein the printed substrate comprises at least one of conductor tracks, spacers and a decorative pattern.

11. The process of claim 10, wherein the printed substrate comprises conductor tracks.

12. The process of claim 1, wherein the at least one filler comprises a conductive filler.

13. The process of claim 1, wherein the at least one filler comprises a catalytically active filler.

14. A composition comprising:
   (a) a matrix-forming condensate which comprises polyorganosiloxanes, obtainable by a sol-gel process which comprises a partial hydrolysis and polycondensation of:
      (A) at least one organosilane of formula $R_nSiX_{(4-n)}$, wherein each R independently represents a non-hydrolyzable group, each X independently represents a hydroxy group or a hydrolyzable group, and n represents 0, 1, 2 or 3; or an oligomer derived therefrom;
      (B) optionally, at least one silane of formula $SiX_4$, wherein X is as defined above, and
      (C) optionally, one or more compounds of at least one of glass-forming elements and ceramic-forming elements;
   (b) at least one filler selected from coloring fillers, luminescent fillers, conductive fillers and catalytically active fillers;
   (c) at least one organic solvent having a boiling point of at least 150° C.; and
   (d) at least one rheology control agent for providing structural viscosity or thixotropy.

15. The composition of claim 14, wherein component (A) accounts for at least 40 mol %, based on the total of components (A) to (C).

16. The composition of claim 14, wherein component (A) accounts for at least 60 mol %, based on the total of components (A) to (C).

17. The composition of claim 15, wherein component (B) accounts for not more than 40 mol %, based on the total of components (A) to (C).

18. The composition of claim 14, wherein the at least one filler comprises a conductive filler.

19. The composition of claim 18, wherein the conductive filler is present in an amount of from 50 to 80% by weight.

20. The composition of claim 19, wherein the conductive filler is present in an amount of from 70 to 75% by weight.

21. The composition of claim 14, wherein the at least one filler comprises a coloring filler.

22. The composition of claim 14, wherein the at least one filler comprises a luminescent filler.

23. The composition of claim 14, wherein the at least one filler comprises a catalytically active filler.

24. The composition of claim 14, wherein the at least one filler comprises at least one of a dye, a colored pigment, a photoluminescent substance, a electroluminescent substance, an electrically conductive material, a photoconductive material and a catalytically active material.

25. The composition of claim 14, wherein the at least one filler comprises a particulate conductive material selected from gold, silver, copper, nickel, tungsten, molybdenum, tin oxide, indium tin oxide, lead zirconate titanate, graphite and combinations thereof.

26. The composition of claim 14, wherein the composition is essentially free of glass particles.

27. The composition of claim 14, wherein the at least one organic solvent comprises a solvent having a boiling point of at least 180° C.

28. The composition of claim 27, wherein the at least one organic solvent is present in an amount of up to 50% by weight.

29. The composition of claim 14, wherein the at least one rheology control agent comprises an organic rheology control agent.

30. The composition of claim 14, wherein the at least one rheology control agent comprises at least one of a fish oil, a cellulose, a cellulose derivative and a polyalcohol.

31. The composition of claim 14, wherein the at least one rheology control agent is present in an amount of not more than 5% by weight.

32. The composition of claim 30, wherein the at least one rheology control agent is present in an amount of from 0.5% by weight to 2% by weight.

33. A composition comprising:
   (a) a matrix-forming condensate which comprises polyorganosiloxanes, obtained by a sol-gel process which comprises a partial hydrolysis and polycondensation of:
      (A) at least one organosilane of formula $R_n SiX_{(4-n)}$, wherein each R independently represents a non-hydrolyzable group, each X independently represents a hydroxy group or a hydrolyzable group, and n represents 0, 1, 2 or 3; or an oligomer derived therefrom;
      (B) optionally, at least one silane of formula $SiX_4$, wherein X is as defined above, and
      (C) optionally, one or more compounds of at least one of glass-forming elements and ceramic-forming elements;
      wherein component (A) accounts for at least 60 mol % of the total of components (A) to (C);
   (b) at least one filler which comprises a particulate conductive material selected from gold, silver, copper, nickel, tungsten, molybdenum, tin oxide, indium tin oxide, lead zirconate titanate, graphite and combinations thereof;
   (c) 1% by weight to 30% by weight of at least one organic solvent having a boiling point of at least 200° C.; and
   (d) from 0.5% by weight to 2% by weight of a rheology control agent which comprises at least one of a fish oil, a cellulose, a cellulose derivative and a polyalcohol.

* * * * *